United States Patent
Nagao

(10) Patent No.: US 11,810,642 B2
(45) Date of Patent: Nov. 7, 2023

(54) MEMORY DEVICE INCLUDING DEFECTIVE COLUMN ADDRESSES STORED IN ASCENDING ORDER

(71) Applicant: Kioxia Corporation, Tokyo (JP)

(72) Inventor: Osamu Nagao, Fujisawa Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/687,244

(22) Filed: Mar. 4, 2022

(65) Prior Publication Data
US 2023/0042340 A1 Feb. 9, 2023

(30) Foreign Application Priority Data
Aug. 3, 2021 (JP) ................................. 2021-127416

(51) Int. Cl.
*G11C 7/10* (2006.01)
*G11C 8/06* (2006.01)

(52) U.S. Cl.
CPC ............ *G11C 7/1087* (2013.01); *G11C 7/106* (2013.01); *G11C 7/1069* (2013.01); *G11C 7/1096* (2013.01); *G11C 8/06* (2013.01)

(58) Field of Classification Search
None
See application file for complete search history.

(56) References Cited

U.S. PATENT DOCUMENTS

| | | | | |
|---|---|---|---|---|
| 5,808,944 A * | 9/1998 | Yoshitake | ............... | G11C 29/80 365/236 |
| 2001/0015908 A1* | 8/2001 | Katayama | ............... | G11C 29/88 365/185.03 |
| 2006/0152984 A1* | 7/2006 | Poechmueller | ...... | G11C 29/785 365/200 |
| 2006/0268634 A1* | 11/2006 | Ogawa | ................. | G11C 29/838 365/200 |
| 2013/0055048 A1* | 2/2013 | Yu | .......................... | G11C 29/76 714/763 |
| 2013/0314992 A1* | 11/2013 | Takagiwa | ............... | H10B 43/27 365/185.09 |
| 2014/0289569 A1 | 9/2014 | Tachikawa et al. | | |

FOREIGN PATENT DOCUMENTS

JP 2014186772 A 10/2014

* cited by examiner

*Primary Examiner* — J. H. Hur
(74) *Attorney, Agent, or Firm* — Holtz, Holtz & Volek PC

(57) ABSTRACT

A memory device includes: a memory cell array; a first latch; a second latch; a first circuit; and a second circuit. The memory cell array includes first, second, and third columns associated with first, second, and third addresses, respectively. The first latch stores the first address and is associated with a fourth address. The second latch stores the second address and is associated with a fifth address. The fourth address and the fifth address are in an ascending order. The first circuit selects the third column in place of the first column based on the first address. The second circuit determines whether or not the first address and the second address are in an ascending order.

17 Claims, 12 Drawing Sheets

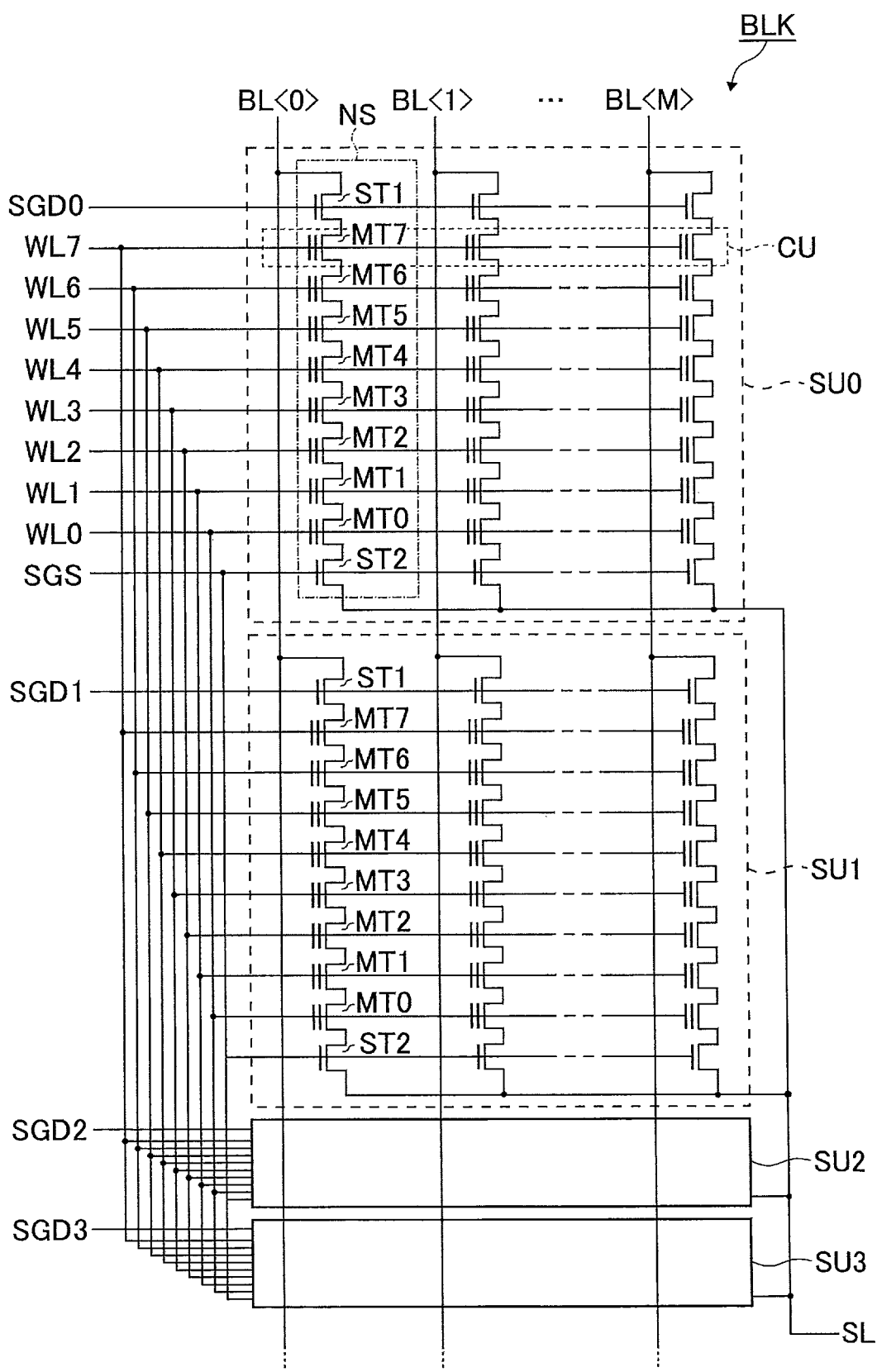
F I G. 3

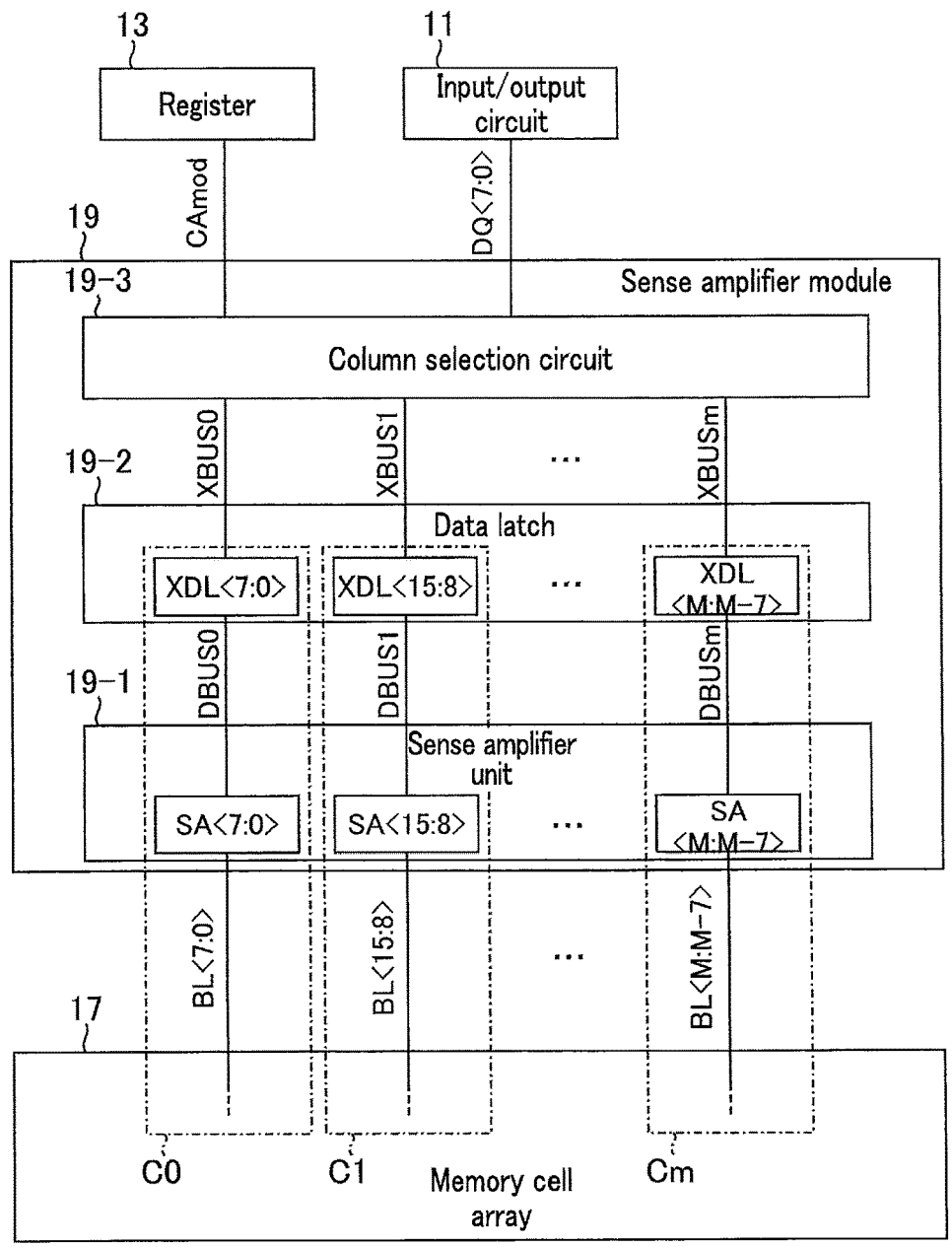
F I G. 4
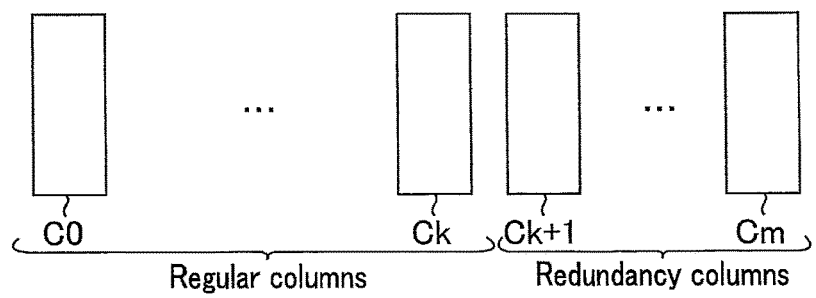
F I G. 5

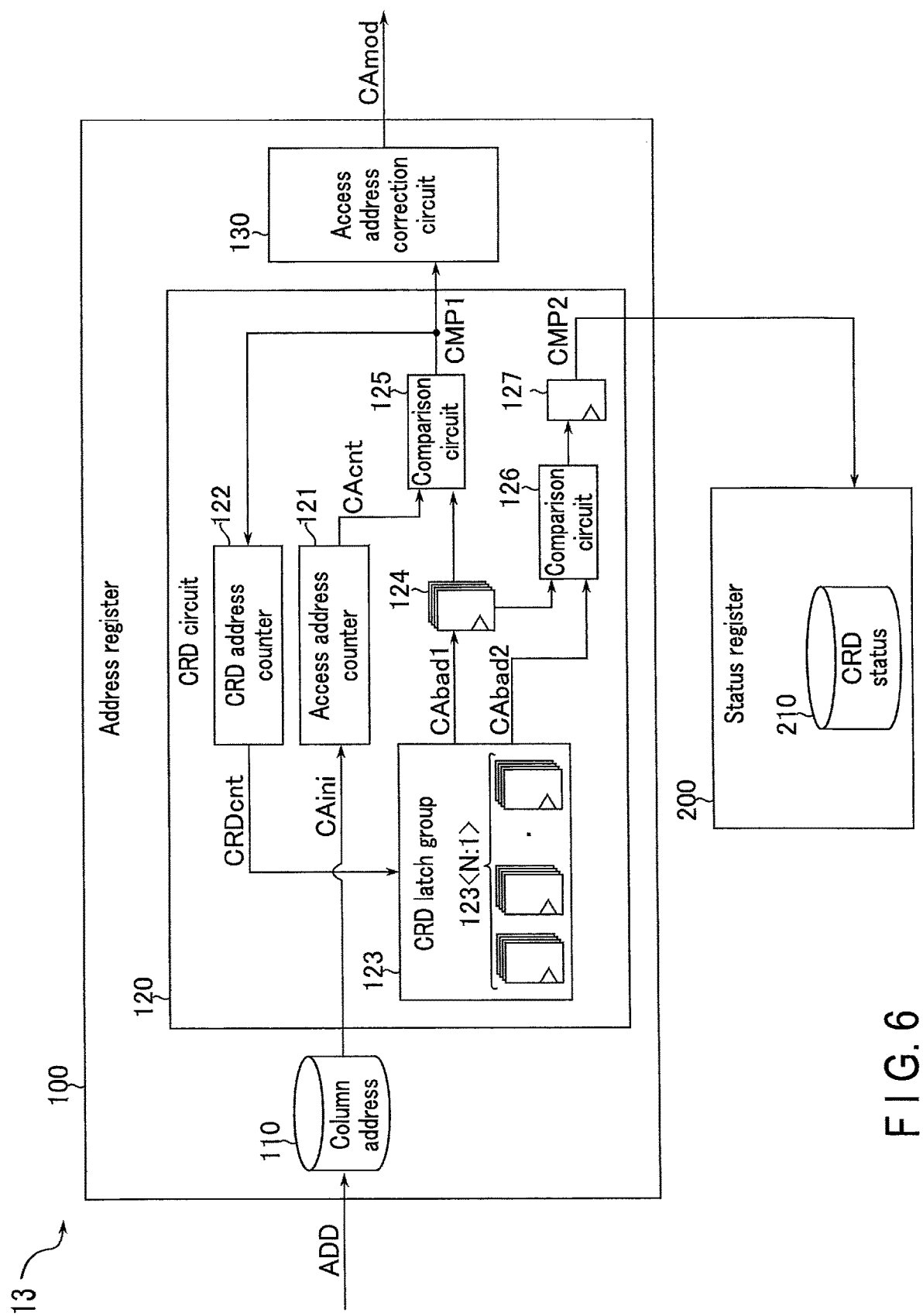
F I G. 6

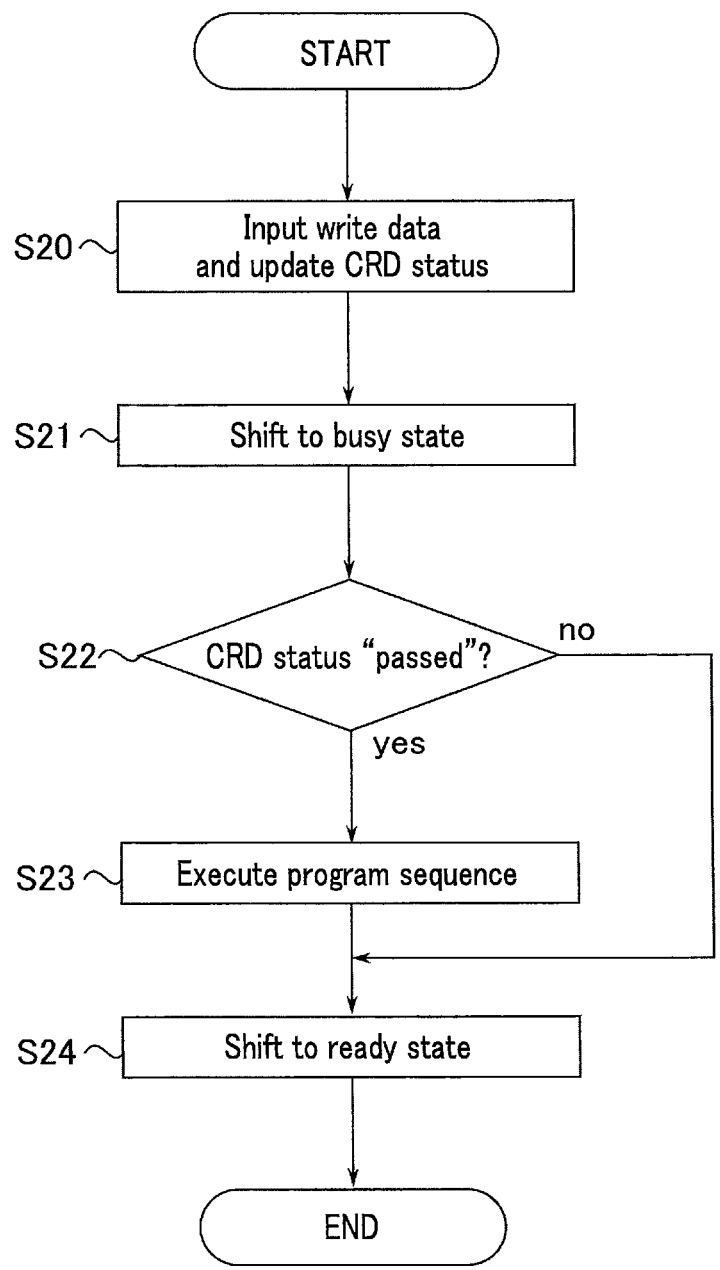
F I G. 8

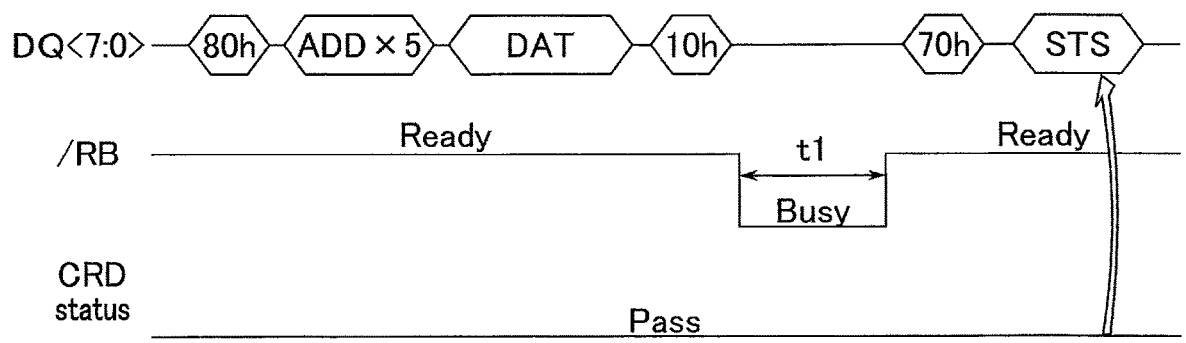
F I G. 9
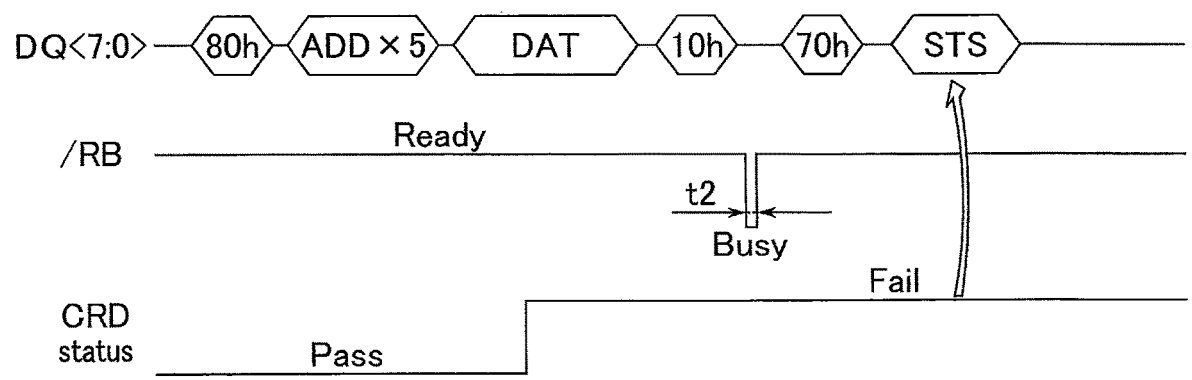
F I G. 10

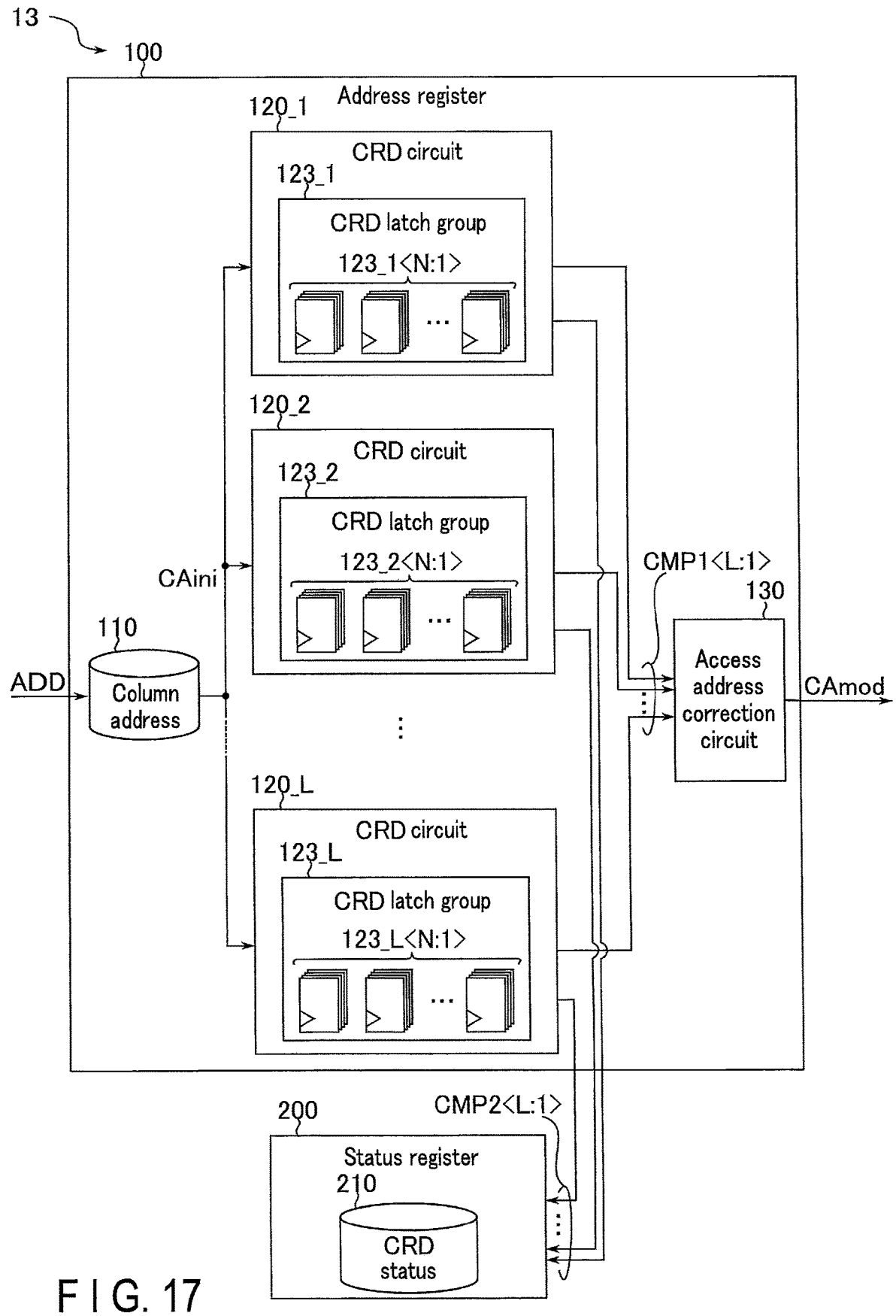
F I G. 17

MEMORY DEVICE INCLUDING DEFECTIVE COLUMN ADDRESSES STORED IN ASCENDING ORDER

CROSS-REFERENCE TO RELATED APPLICATIONS

This application is based upon and claims the benefit of priority from Japanese Patent Application No. 2021-127416, filed Aug. 3, 2021, the entire contents of which are incorporated herein by reference.

FIELD

Embodiments described herein relate generally to a memory device.

BACKGROUND

A NAND flash memory is known as a memory device capable of storing data in a non-volatile manner. A memory cell array in such a NAND flash memory includes regular columns and redundancy columns. When there is a defective regular column, a redundancy column is used for data storage instead of the defective regular column.

BRIEF DESCRIPTION OF THE DRAWINGS

FIG. 3 is a circuit diagram showing an example of a circuit configuration of the memory cell array included in the memory device according to the embodiment.

FIG. 4 is a block diagram showing an example of a coupling relationship between a sense amplifier module included in the memory device according to the embodiment and an input/output circuit, a register, and a memory cell array.

FIG. 5 is a block diagram showing an example of a configuration of columns according to the embodiment.

FIG. 6 is a block diagram showing an example of a configuration of a part of the register according to the embodiment.

FIG. 8 is a flowchart showing an example of a write operation in the memory device according to the embodiment.

FIG. 9 is a command sequence showing an example of a write operation in the memory system according to the embodiment.

FIG. 10 is a command sequence showing an example of a write operation in the memory system according to the embodiment.

FIG. 17 is a block diagram showing an example of a configuration of a part of a register according to a modification.

DETAILED DESCRIPTION

Figure 1:
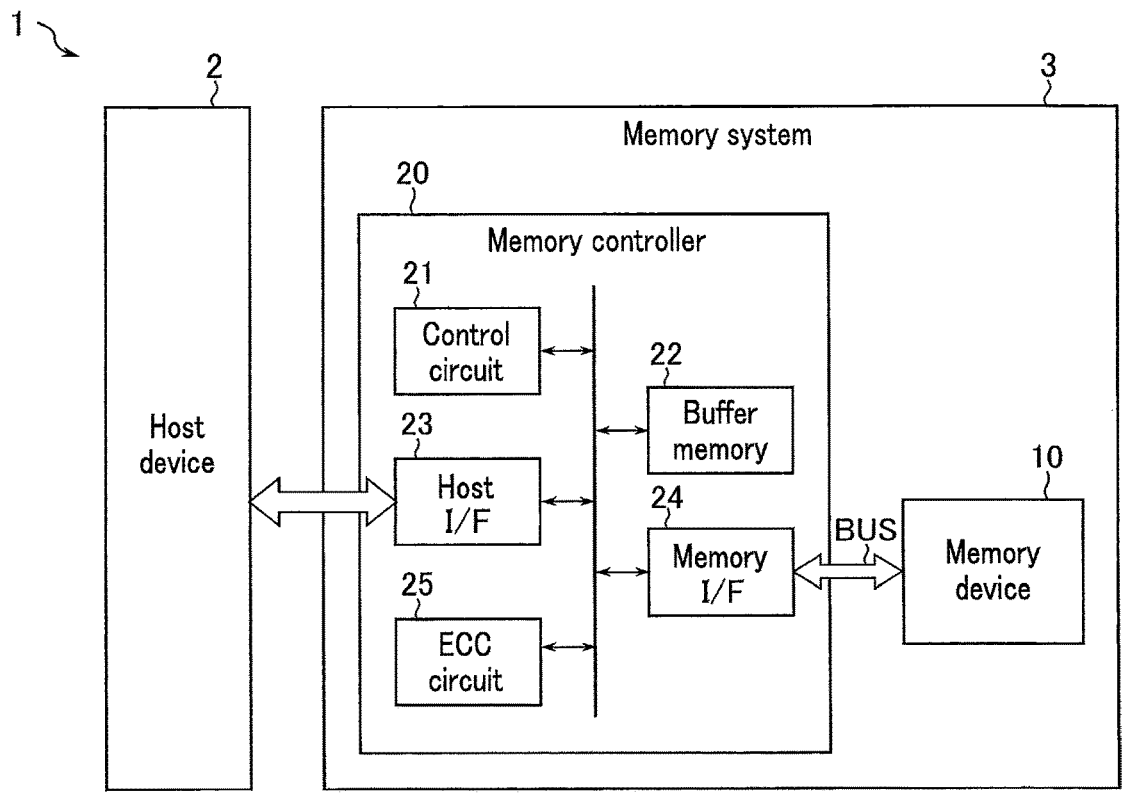
FIG. 1 is a block diagram showing an example of a configuration of an information processing system including a memory system according to an embodiment.

In general, according to one embodiment, a memory device includes: a memory cell array; a first latch; a second latch; a first circuit; and a second circuit. The memory cell array includes a first column associated with a first address, a second column associated with a second address, and a third column associated with a third address. The first latch stores the first address and is associated with a fourth address. The second latch stores the second address and is associated with a fifth address. The fourth address and the fifth address are in an ascending order. The first circuit selects the third column in place of the first column based on the first address. The second circuit determines whether or not the first address and the second address are in an ascending order.

Hereinafter, embodiments will be described with reference to the drawings.

In the description that follows, components having approximately the same function and configuration will be assigned a common reference numeral. To particularly distinguish a plurality of components with a similar configuration, such components may be referred to by an identical reference numeral with different characters or numbers added at the end.

1. Embodiment

1. 1. Configuration

1. 1. 1. Information Processing System

A configuration of an information processing system according to an embodiment will be described.

FIG. 1 is a block diagram showing an example of a configuration of an information processing system according to an embodiment. As shown in FIG. 1, an information processing system 1 includes a host device 2 and a memory system 3.

The host device 2 is an information processing apparatus provided outside the memory system 3. The host device 2 is, for example, a personal computer or a server in a data center.

The memory system 3 is a storage device. The memory system 3 is, for example, a memory card such as an SD™ card, a Universal Flash Storage (UFS), or a solid-state drive (SSD). The memory system 3 executes a write operation, a read operation, or an erase operation of data in response to a request from the host device 2. The memory system 3 may execute a write operation, a read operation, and an erase operation as internal processing that is irrelevant to a request from the host device 2.

1. 1. 2. Memory System

An internal configuration of the memory system according to the embodiment will be described.

The memory system 3 includes a memory device 10 and a memory controller 20.

The memory device 10 is, for example, a NAND flash memory. The memory device 10 stores data in a non-volatile manner.

The memory controller 20 is configured of an integral circuit such as a system on a chip (SoC). The memory controller 20 controls the memory device 10 in response to a request from the host device 2. Specifically, for example, the memory controller 20 writes write data into the memory device 10 in response to a write request from the host device 2. Also, the memory controller 20 reads read data from the memory device 10 in response to a read request from the host device 2. The memory controller 20 transmits the read data to the host device 2.

Next, an internal configuration of the memory controller 20 will be described. The memory controller 20 includes a control circuit 21, a buffer memory 22, a host interface circuit 23 (host I/F), a memory interface circuit 24 (memory I/F), and an ECC circuit 25. A function of the memory controller 20 to be described below may be implemented either as a hardware configuration, or as a combined configuration of hardware resources and firmware.

The control circuit 21 controls the entirety of the memory controller 20. The control circuit 21 includes, for example, a processor such as a central processing unit (CPU), and a read-only memory (ROM).

The buffer memory 22 is a memory for buffering data between the host device 2 and the memory device 10. The buffer memory 22 is, for example, a static random access memory (SRAM). The buffer memory 22 temporarily stores write data and read data.

The host interface circuit 23 manages communications between the memory controller 20 and the host device 2. The host interface circuit 23 is coupled to the host device 2 via a host bus. The host bus is, for example, an SD™ interface, a Serial Attached SCSI (Small Computer System Interface) (SAS), a Serial Advanced Technology Attachment (SATA), or a Peripheral Component Interconnect Express (PCIe™).

The memory interface circuit 24 manages communications between the memory device 10 and the memory controller 20.

The memory interface circuit 24 is coupled to the memory device 10 via a memory bus BUS. The memory bus BUS is, for example, a bus compatible with a single data rate (SDR) interface, a toggle double data rate (DDR) interface, or an Open NAND Flash Interface (ONFI).

The ECC circuit 25 performs an error detection process and an error correction process on data stored in the memory device 10. That is, during a data write operation, the ECC circuit 25 adds an error correction code to write data. During a data read operation, the ECC circuit 25 decodes read data, and detects whether or not an error bit exists. If an error bit is detected, the ECC circuit 25 specifies a column address (error position) of the error bit, and corrects the error.

1. 1. 3. Memory Device

Figure 2:
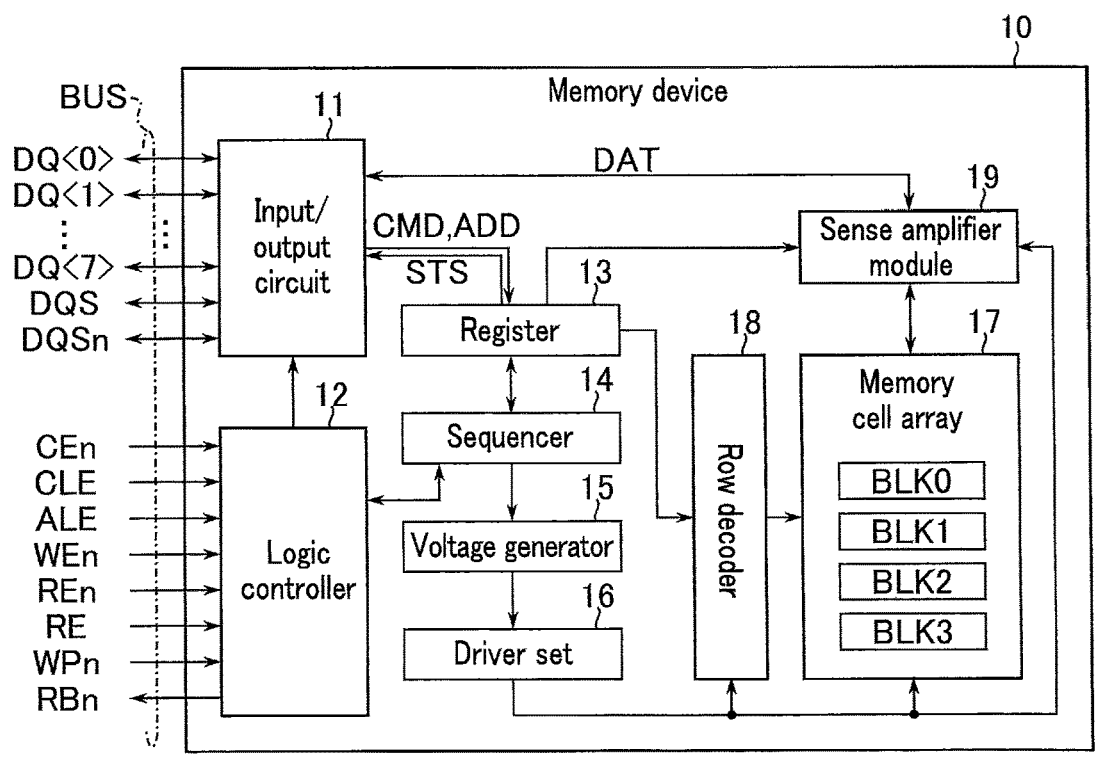
FIG. 2 is a block diagram showing an example of a configuration of a memory device included in the memory system according to the embodiment.

Hereinafter, an internal configuration of the memory device according to the embodiment will be described. FIG. 2 is a block diagram showing an example of a configuration of the memory device included in the memory system according to the embodiment.

The memory device 10 includes an input/output circuit 11, a logic controller 12, a register 13, a sequencer 14, a voltage generator 15, a driver set 16, a memory cell array 17, a row decoder 18, and a sense amplifier module 19.

The input/output circuit 11 and the logic controller 12 transmit and receive various signals to and from the memory controller 20 via the memory bus BUS. The signals transmitted and received by the input/output circuit 11 include, for example, signals DQ<0>, DQ<1>, . . . , and DQ<7> (signals DQ<7:0>), and signals DQS and DQSn. The signals transmitted and received by the logic controller 12 include, for example, signals CEn, CLE, ALE, WEn, RE and REn, WPn, and RBn. Herein, "n" at the end of a name of a signal means that the signal is asserted when it is in a "Low (L)" level.

The signals DQ<7:0> are signals containing 8-bit data. The signals DQ<7:0> are an entity of data DAT transmitted and received between the memory device 10 and the memory controller 20. Hereinafter, the signals DQ<7:0> transmitted from the memory controller 20 to the memory device 10 will be referred to as "input signals DQ<7:0>". The signals DQ<7:0> transmitted from the memory device 10 to the memory controller 20 will be referred to as "output signals DQ<7:0>". The input signals DQ<7:0> include, for example, write data DAT, an address ADD, and a command CMD. The output signals DQ<7:0> include, for example, read data DAT and a status STS.

The signals DQS and DQSn are strobe signals. The signal DQSn is an inversion signal of the signal DQS. The signal CEn is a signal for enabling the memory device 10.

The signals CLE and ALE are signals that notify the memory device 10 that the input signals DQ<7:0> are a command CMD and an address ADD, respectively.

The signal WEn is a signal for causing the memory device 10 to fetch the input signals DQ<7:0>.

The signals RE and REn are signals for causing the memory device 10 to read the output signals DQ<7:0>.

The signal WPn is a signal for instructing the memory device 10 to inhibit a write operation or an erase operation.

The signal RBn is a signal indicating whether the memory device 10 is in a ready state or a busy state. The ready state is a state in which the memory device 10 is capable of receiving an instruction from the memory controller 20. The busy state is a state in which the memory device 10 cannot receive an instruction from the memory controller 20. The signal RBn shows that the "L" level is a busy state.

The input/output circuit 11 transmits the address ADD and command CMD and the write data DAT in the input signals DQ<7:0> to the register 13 and the sense amplifier module 19, respectively. The input/output circuit 11 receives the status STS and the read data DAT in the output signals DQ<7:0> from the register 13 and the sense amplifier module 19, respectively.

The logic controller 12 receives, from the memory controller 20, the signals CEn, CLE, ALE, WEn, RE and REn, and WPn. The logic controller 12 transmits the signal RBn to the memory controller 20.

The register 13 stores the address ADD, the command CMD, and the status STS. The address ADD includes, for example, a column address, a block address, and a page address.

The sequencer 14 controls the entire operation of the memory device 10 based on the command CMD stored in the register 13.

The voltage generator 15 generates voltages used in a write operation, a read operation, an erase operation, etc.

The driver set 16 supplies the voltages generated by the voltage generator 15 to the memory cell array 17, the row decoder 18, and the sense amplifier module 19.

The memory cell array 17 includes a plurality of blocks BLK, a plurality of bit lines, and a plurality of word lines. In the example of FIG. 2, a case is shown where the memory cell array 17 includes four blocks BLK0, BLK1, BLK2, and BLK3. The block BLK is, for example, a unit of erasure of data DAT in an erase operation. Each block BLK includes a plurality of memory cell transistors. Each memory cell transistor is associated with a set of a bit line and a word line.

The row decoder 18 selects one of the blocks BLK0 to BLK3 based on a block address in the register 13. The row decoder 18 further selects a word line in the selected block BLK based on a page address in the register 13.

The sense amplifier module 19 selects a bit line based on a column address in the register 13. In a data write operation, the sense amplifier module 19 transfers write data DAT to the memory cell array 17 via the selected bit line. In a data read operation, the sense amplifier module 19 senses a threshold voltage of a memory cell transistor via the selected bit line. The sense amplifier module 19 generates read data DAT based on a result of the sensing.

1. 1. 4. Memory Cell Array

Next, a configuration of the memory cell array included in the memory device according to the embodiment will be described. FIG. 3 is a circuit diagram showing an example of a circuit configuration of the memory cell array included in the memory device according to the embodiment. In FIG. 3, one of the blocks BLK included in the memory cell array 17 is shown. As shown in FIG. 3, the block BLK includes, for example, four string units SU0 to SU3.

Each string unit SU includes a plurality of NAND strings NS respectively associated with bit lines BL<0> to BL<M> (where M is an integer equal to or greater than 2). Each NAND string NS includes, for example, memory cell transistors 0 to MT7 and select transistors ST1 and ST2. Each memory cell transistor MT includes a control gate and a charge storage layer. Each memory cell transistor MT stores data in a non-volatile manner. Each of the select transistors ST1 and ST2 is used for selection of a string unit SU in various operations.

In each NAND string NS, the memory cell transistors MT0 to MT8 are coupled in series. A drain of the select transistor ST1 is coupled to a bit line BL associated therewith, and a source of the select transistor ST1 is coupled to one end of a set of memory cell transistors MT0 to MT8 coupled in series. A drain of the select transistor ST2 is coupled to the other end of the set of memory cell transistors MT0 to MT7 coupled in series. A source of the select transistor ST2 is coupled to a source line SL.

Control gates of the memory cell transistors MT0 to MT7 in the same block BLK are respectively coupled to the word lines WL0 to WL7. Gates of select transistors ST1 in the string units SU0 to SU4 are respectively coupled to the select gate lines SGD0 to SGD4. Gates of the select transistors ST2 are coupled to a select gate line SGS.

Different column addresses are assigned to the bit lines BL<0> to BL<M>. Each bit line BL is shared among a plurality of NAND strings NS to which the same column address is assigned in a plurality of blocks BLK. Each of the word lines WL0 to WL7 is provided for each block BLK. The source line SL is, for example, shared among a plurality of blocks BLK. A set of memory cell transistors MT coupled to a common word line WL in each string unit SU is referred to as, for example, a "cell unit CU". The storage capacity of a cell unit CU including memory cell transistors MT that each stores, for example, 1-bit data is defined as "1-page data". The cell unit CU may have a storage capacity of two or more pages of data according to the number of bits of data stored in the memory cell transistors MT.

A circuit configuration of the memory cell array 17 included in the memory device 10 according to the embodiment is not limited to the configuration described above. For example, the number of string units SU included in each block BLK may be designed to be a desired number. The number of memory cell transistors MT and the number of select transistors ST1 and ST2 included in each NAND string NS may be designed to be a desired number.

1. 1. 5. Sense Amplifier Module

Next, a configuration of the sense amplifier module included in the memory device according to the embodiment will be described. FIG. 4 is a block diagram showing an example of a coupling relationship between the sense amplifier module included in the memory device according to the embodiment and the input/output circuit, the register, and the memory cell array. As shown in FIG. 4, the sense amplifier module 19 includes a sense amplifier unit 19-1, a data latch 19-2, and a column selection circuit 19-3.

The sense amplifier unit 19-1 performs sensing of a threshold voltage and generation of read data DAT in a read operation. The sense amplifier unit 19-1 includes, for example, (M+1) sense amplifiers SA. The (M+1) sense amplifiers SA are classified into (m+1) sense amplifier groups SA<7:0>, SA<15:8>, . . . , and SA<M:M−7>, each of which includes eight sense amplifiers SA (where m is, for example, an integer that satisfies (m+1)=(M+1)/8). In the example of FIG. 4, a case is shown where m is equal to or greater than 2 (i.e., M is 23, 31, . . . ).

Eight sense amplifiers SA<0> to SA<7> in the sense amplifier group SA<7:0> are respectively coupled to bit lines BL<0> to BL<7>. Eight sense amplifiers SA<8> to SA<15> in the sense amplifier group SA<15:8> are respectively coupled to bit lines BL<8> to BL<15>. Similarly, eight sense amplifiers SA<M−7> to SA<M> in the sense amplifier group SA<M:M−7> are respectively coupled to bit lines BL<M−7> to BL<M>.

The data latch 19-2 temporarily stores data DAT transmitted and received to and from the input/output circuit 11. The data latch 19-2 includes, for example, (M+1) data latches XDL. The (M+1) data latches XDL are classified into (m+1) data latch groups XDL<7:0>, XDL<15:8>, . . . , and XDL<M:M−7>, each of which includes eight data latches XDL.

The data latch group XDL<7:0> is coupled to the sense amplifier group SA<7:0> via a bus DBUS0. The data latch group XDL<15:8> is coupled to the sense amplifier group SA<15:8> via a bus DBUS1. Similarly, the data latch group XDL<M:M−7> is coupled to the sense amplifier group SA<M:M−7> via a bus DBUSm.

In the description that follows, a set of memory cell transistors MT coupled to the bit lines <7:0>, the sense amplifiers SA<7:0>, and the data latches XDL<7:0> will also be referred to as a "column C0". A set of memory cell transistors MT coupled to the bit lines <15:8>, the sense amplifiers SA<15:8>, and the data latches XDL<15:8> will also be referred to as a "column C1". Similarly, a set of memory cell transistors MT coupled to the bit lines <M:M−8>, the sense amplifiers SA<M:M−8>, and the data latches XDL<M:M−8> will also be referred to as a "column Cm".

The columns C0, C1, . . . , and Cm are respectively associated with column addresses CA0, CA1, . . . , and CAm.

The column selection circuit 19-3 selects a column. The column selection circuit 19-3 is coupled to the data latch groups XDL<7:0>, XDL<15:8>, . . . , and XDL<M:M−8> via buses XBUS<0>, XBUS<1>, . . . , and XBUS<m>, respectively. The column selection circuit 19-3 receives a column address CAmod from the register 13. The column address CAmod uniquely identifies one of the column addresses CA0 to CAm.

In a write operation, the column selection circuit 19-3 receives, for example, signals DQ<7:0> including write data DAT from the input/output circuit 11. The column selection circuit 19-3 transmits the write data DAT to a column selected based on the column address CAmod.

In a read operation, the column selection circuit 19-3 receives, for example, read data DAT from the column selected based on the column address CAmod. The column selection circuit 19-3 transmits, to the input/output circuit 11, the signals DQ<7:0> including the read data DAT.

FIG. 5 is a block diagram showing an example of a configuration of columns according to the embodiment. As shown in FIG. 5, the columns C0 to Cm are, for example, classified into regular columns C0 to Ck and redundancy columns C(k+1) to Cm (0<k<m). The regular columns C0 to Ck are columns that are used with a higher priority than the redundancy columns. The redundancy columns C(k+1) to Cm are columns that are used as alternatives to the regular columns C0 to Ck.

If the selection target column in the regular columns C0 to Ck is normal, the register 13 transmits a column address (access address) corresponding to the selection target column to the column selection circuit 19-3 as a column address CAmod. On the other hand, if the selection target column in the regular columns C0 to Ck is defective, the register 13 transmits a column address corresponding to a column in the redundancy columns C(k+1) to Cm to the column selection circuit 19-3 as a column address CAmod. With the above-described configuration, it is possible to execute a write operation and a read operation while avoiding selection of a defective column.

1. 1. 6. Register

Next, a configuration of the register according to the embodiment will be described. FIG. 6 is a block diagram showing an example of a configuration of a part of the register according to the embodiment. As shown in FIG. 6, the register 13 includes an address register 100 and a status register 200. The address register 100 includes a register that stores a column address 110 in an address ADD. The address register 100 further includes a column redundancy (CRD) circuit 120 and an access address correction circuit 130.

The CRD circuit 120 includes an access address counter 121, a CRD address counter 122, a CRD latch group 123, an address latch 124, comparison circuits 125 and 126, and a latch 127.

The access address counter 121 receives a column address CAini from the column address 110. The access address counter 121 generates a column address CAcnt based on the column address CAini. The column address CAini is a column address that is to be the first selection target in a write operation or a read operation. The column address CAcnt is a column address obtained by incrementing the column address CAini as an initial value. The access address counter 121 transmits the column address CAcnt to the comparison circuit 125.

The CRD address counter 122 receives a signal CMP1 from the comparison circuit 125. The signal CMP1 is a 1-bit signal. An H-level signal CMP1 indicates that the column address CAcnt corresponds to a defective column. An L-level signal CMP1 indicates that the column address CAcnt corresponds to a regular column. Upon receiving the H-level signal CMP1, the CRD address counter 122 increments an address CRDcnt. The address CRDcnt is an address that corresponds to one of a plurality of CRD latches in the CRD latch group 123. The CRD address counter 122 transmits the address CRDcnt to the CRD latch group 123.

The CRD latch group 123 includes N CRD latches 123<N:1> (where N is an integer equal to or greater than 2). Each of the N CRD latches 123<N:1> stores a column address corresponding to a defective column. Addresses CRDcnt associated with the N CRD latches 123<N:1> are in an ascending order. That is, the address CRDcnt associated with the CRD latch 123<J+1> is larger than the address CRDcnt associated with the CRD latch 123<J>, where J is an integer smaller than N. For example, upon a hardware reset operation of the memory device 10, column addresses corresponding to defective columns are stored in the N CRD latches 123<N:1> in an ascending order. That is, the column address of the defective column stored in the CRD latch 123<J+1> is larger than the column address of the defective column stored in the CRD latch 123<J>, where J is an integer smaller than N. There are cases where, the column addresses stored in the N CRD latches 123<N:1> after a hardware reset deviate from an ascending order due to unintended data inversion, etc.

The CRD latch group 123 selects a CRD latch corresponding to the address CRDcnt. When address CRDcnt=Y, for example, the CRD latch group 123 transmits a column address stored in the CRD latch 123<Y> to the address latch 124 as a column address CAbad1 (1≤Y≤N). Also, when address CRDcnt=Y, the CRD latch group 123 transmits a column address stored in the CRD latch 123<Y+1> to a comparison circuit 126 as a column address CAbad2.

The address latch 124 stores a single column address. Upon receiving the column address CAbad1 from the CRD latch group 123, the address latch 124 stores the column address CAbad1, and transmits it to the comparison circuits 125 and 126.

The comparison circuit 125 compares the column address CAcnt received from the access address counter 121 and the column address CAbad1 received from the address latch 124. When the result of the comparison is that the column address CAcnt matches the column address CAbad1, the comparison circuit 125 generates an H-level signal CMP1. When the result of the comparison is that the column address CAcnt does not match the column address CAbad1, the comparison circuit 125 generates an L-level signal CMP1. The comparison circuit 125 transmits the signal CMP1 to the CRD address counter 122 and the access address correction circuit 130.

The comparison circuit 126 compares the column address CAbad1 received from the address latch 124 and the column address CAbad2 received from the CRD latch group 123. Based on the results of the comparison, the comparison circuit 126 generates a signal CMP2. The signal CMP2 is a 1-bit signal. Specifically, when the column address CAbad1 and the column address CAbad2 deviate from an ascending order, the comparison circuit 126 generates an H-level signal CMP2. When the column address CAbad1 and the column address CAbad2 are in an ascending order, the comparison circuit 126 generates an L-level signal CMP2. That is, the signal CMP2 is a signal for determining whether or not the above-described storage rules for the column addresses in two CRD latches with adjacent addresses are obeyed. The comparison circuit 126 transmits the signal CMP2 to the latch 127.

The latch 127 stores 1-bit data. Upon receiving the signal CMP2 from the comparison circuit 126, the latch 127 stores the signal CMP2 and transmits it to the status register 200.

Based on the signal CMP1 received from the comparison circuit 125, the access address correction circuit 130 generates a column address CAmod. Specifically, when the signal CMP1 is at an L level, the access address correction circuit 130 applies the column address CAcnt to the column address CAmod. When the signal CMP1 is at an H level, the access address correction circuit 130 applies a column address corresponding to one of the columns in the redundancy columns $C(k+1)$ to $Cm$ to the column address CAmod. The access address correction circuit 130 transmits the generated column address CAmod to the column selection circuit 19-3.

The status register 200 includes a register that stores a CRD status 210. The CRD status 210 is information that indicates whether or not the column addresses stored in the CRD latch group 123 are, in the order of the CRD latches 123<1>, 123 <2>, ... , 123<N>, in an ascending order. For example, upon receiving an H-level signal CMP2, the status register 200 updates the CRD status 210 to a failed state. Upon receiving an L-level signal CMP2, the status register 200 maintains the state of the CRD status 210 (if it is in a passed state, the passed state is maintained, and if it is in a failed state, the failed state is maintained).

1. 2. Operation

1. 2. 1. Write Operation

A write operation in the memory system according to the embodiment will be described.

(Flowchart)

Figure 7:
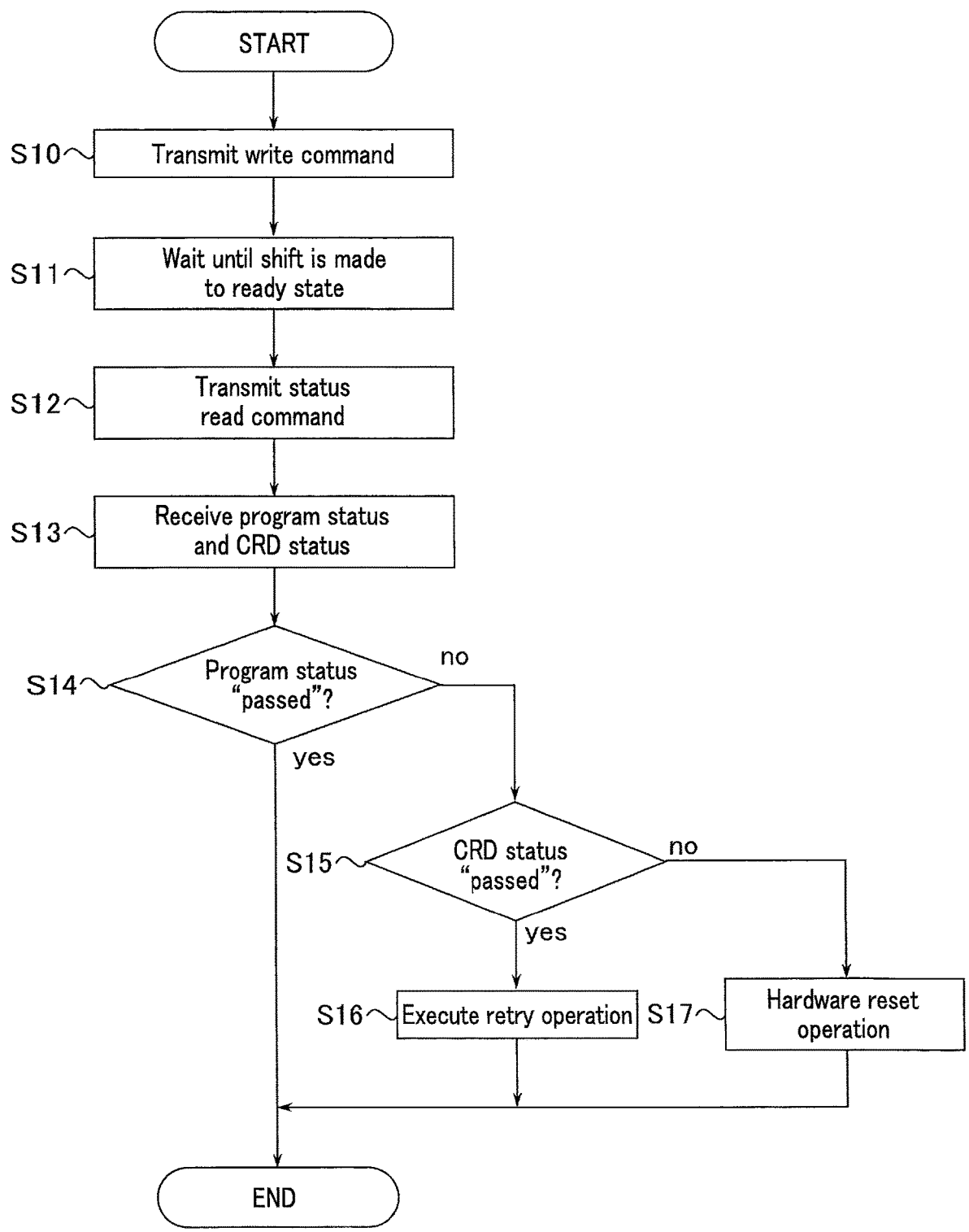
FIG. 7 is a flowchart showing an example of a write operation in the memory controller according to the embodiment.

First, a write operation in the memory controller according to the embodiment will be described with reference to the flowchart. FIG. 7 is a flowchart showing an example of a write operation in the memory controller according to the embodiment.

When conditions for a write operation are satisfied (START), the memory controller 20 transmits a write command to the memory device 10 (S10). The memory controller 20 also transmits an address ADD and write data DAT. The conditions for a write operation include, for example, write data DAT received from the host device 2 being stored in the buffer memory 22 by an amount equal to or greater than a predetermined amount.

After the processing at S10, the memory controller 20 waits until the signal RBn shifts from a busy state to a ready state (S11).

When the signal RBn shifts to a ready state, the memory controller 20 transmits a status read command to the memory device 10 (S12).

In response to the status read command, the memory controller 20 receives a program status and a CRD status from the memory device 10 (S13).

The program status is information indicating whether or not write data DAT has been normally written into the memory cell array 17. When, for example, the write data DAT has been normally written, the program status becomes a passed state. When the write data DAT has not been normally written, the program status becomes a failed state.

The memory controller 20 determines whether or not the program status received in the processing at S13 is a passed state (S14).

If the program status is a passed state (S14; yes), the write operation in the memory controller 20 ends (END).

If the program status is a failed state (S14; no), the memory controller 20 determines whether or not the CRD status received in the processing at S13 is a passed state (S15).

If the CRD status is a passed state (S15; yes), the memory controller 20 executes a retry operation of the write operation (S16). The retry operation includes, for example, re-executing the processing from S10 to S14. In the retry operation, the memory controller 20 may specify an address ADD different from an address ADD in a write operation in which the program status has become a failed state. After the processing at S16, the write operation in the memory controller 20 ends (END).

If the CRD status is a failed state (S15; no), the memory controller 20 executes a hardware reset operation of the memory device 10 (S17). The hardware reset operation is, for example, equivalent to a power on/off operation of the memory device 10, or a reactivation operation of the memory device 10. The hardware reset operation includes an operation of storing column addresses in the CRD latch group 123 in an ascending order.

After the processing at S17, the write operation in the memory controller 20 ends (END).

Next, a write operation in the memory device according to the embodiment will be described. FIG. 8 is a flowchart showing an example of a write operation in the memory device according to the embodiment. FIG. 8 shows processing of the memory device 10 during the processing of S11 of the memory controller 20 shown in FIG. 7.

Upon receiving write data DAT (START), the memory device 10 executes a write data input operation and a CRD status update operation (S20). The write data input operation is an operation of causing the data latch 19-2 to store the write data DAT. The CRD status update operation is an operation of updating the CRD status 210 based on a column address in an access range. The memory device 10 causes the status register 200 to store the updated CRD status 210.

After the processing at S20, the memory device 10 shifts to a busy state (S21). That is, the memory device 10 transmits an L-level signal RBn to the memory controller 20.

The memory device 10 determines whether or not the CRD status 210 updated in the processing at S20 is a passed state (S22).

If the CRD status 210 is a passed state (S22; yes), the memory device 10 executes a program sequence (S23). The program sequence is an operation of writing write data DAT stored in the data latch 19-2 in the processing at S20 into the memory cell array 17.

After the processing at S23, or if the CRD status 210 is a failed state (S22; no), the memory device 10 shifts to a ready state (S24). That is, the memory device 10 transmits an H-level signal RBn to the memory controller 20. In this manner, if the CRD status 210 is a failed state, the memory device 10 shifts to a ready state without performing a program sequence.

After the processing at S24 ends, the write operation in the memory device 10 ends (END).

(Command Sequences)

Next, a write operation in the memory controller according to the embodiment will be described with reference to command sequences. FIGS. 9 and 10 are command sequences each showing an example of a write operation in the memory system according to the embodiment. FIG. 9 shows a case where the CRD status 210 is maintained at a passed state in a write operation. FIG. 10 shows a case where the CRD status 210 is updated from a passed state to a failed state in a write operation.

As shown in FIGS. 9 and 10, the memory controller 20 transmits a command "80h" to the memory device 10. The command "80h" is a command that instructs the memory device 10 to write data.

Subsequently, the memory controller 20 transmits an address ADD to the memory device 10 over, for example, five cycles. The address ADD includes, for example, a column address CAini. The memory controller 20 transmits write data DAT to the memory device 10.

Based on the column address CAini and the write data DAT, the memory device 10 executes a CRD status update operation along with a write data input operation. In the example of FIG. 9, the CRD status 210 is maintained at the passed state. On the other hand, in the example of FIG. 10, the CRD status 210 is updated from the passed state to a failed state.

Subsequently, the memory controller 20 transmits a command "10h" to the memory device 10. The command "10h" is a command that instructs execution of a program sequence to the memory device 10.

Upon receiving the command "10h", the memory device 10 shifts the signal RBn from a ready state to a busy state. Prior to execution of the program sequence, the memory device 10 determines the state of the CRD status 210.

In the example of FIG. 9, the CRD status 210 is a passed state. Accordingly, the memory device 10 executes the program sequence. Thus, the program status can be either a passed state or a failed state. On the other hand, in the example of FIG. 10, the CRD status 210 is a failed state. Accordingly, the memory device 10 does not execute the program sequence. Thus, the program status becomes a failed state. After the program sequence has ended, the memory device 10 shifts the signal RBn from a busy state to a ready state. A busy-state period t2 when the program sequence is not executed is shorter than a busy-state period t1 when the program sequence is executed. For example, the period t2 is a few microseconds, whereas the period t1 is a few milliseconds.

Upon receiving the ready-state signal RBn, the memory controller 20 transmits a command "70h" to the memory device 10. The command "70h" is a command that requests the memory device 10 to transmit a program status and a CRD status 210.

Upon receiving the command "70h", the memory device 10 transmits the program status and the CRD status 210 to the memory controller 20. In the example of FIG. 9, the memory controller 20 receives, in addition to a program status indicating a passed state or a failed state, a CRD status 210 indicating a passed state. If the program status indicates a passed state and the CRD status 210 indicates a passed state, the memory controller 20 recognizes that the column addresses corresponding to the defective columns stored in the CRD latch group 123 are in an ascending order, and that the write data DAT has been normally written. If the program status indicates a failed state and the CRD status 210 indicates a passed state, the memory controller 20 recognizes that the storage rules for the column addresses corresponding to the defective columns in the CRD latch group 123 are obeyed, but that the write data DAT has not been normally written due to other factors. On the other hand, in the example of FIG. 10, the memory controller 20 receives a CRD status 210 indicating a failed state, in addition to a program status indicating a failed state. This allows the memory controller 20 to recognize that the write operation has failed due to the column addresses corresponding to the defective columns stored in the CRD latch group 123 not being in an ascending order.

In the example of FIGS. 9 and 10, a case has been described where the program status and the CRD status 210 are requested by the command "70h"; however, the configuration is not limited thereto. For example, the program status and the CRD status may be requested by different commands. A command that requests the CRD status may be a dedicated command that is not used for purposes other than requesting the CRD status.

1. 2. 2. Read Operation

Next, a read operation in the memory system according to the embodiment will be described.

(Flowchart)

Figure 11:
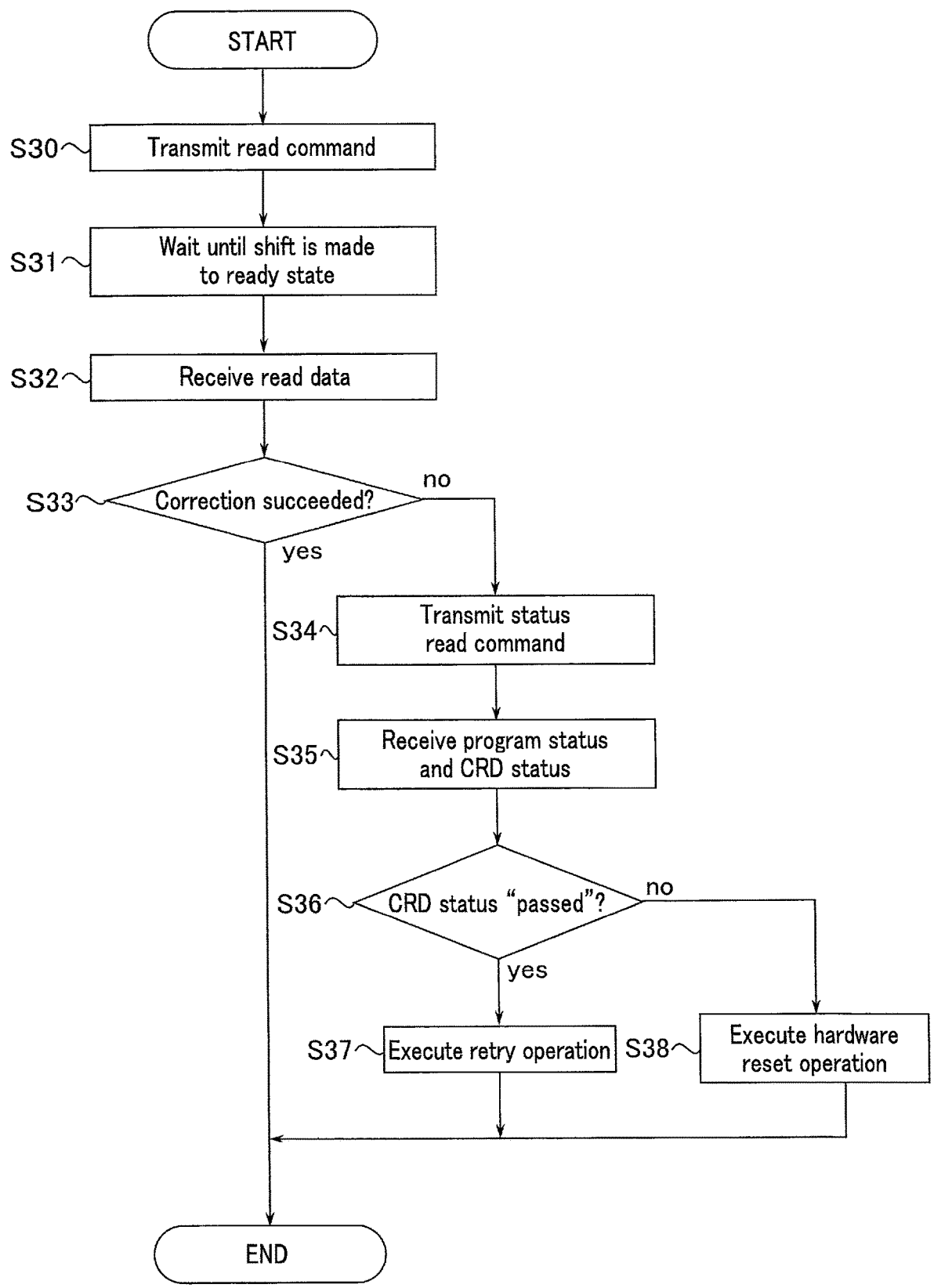
FIG. 11 is a flowchart showing an example of a read operation in the memory controller according to the embodiment.

A read operation in the memory controller according to the embodiment will be described with reference to the flowchart. FIG. 11 is a flowchart showing an example of a read operation in the memory controller according to the embodiment.

When conditions for a read operation are satisfied (START), the memory controller 20 transmits a read command to the memory device 10 (S30). The memory controller 20 also transmits an address ADD. The conditions for a read operation include, for example, receiving a read request from the host device 2. The read operation conditions may include, for example, determining that the memory controller 20 executes a read operation as internal processing.

After the processing at S30, the memory controller 20 waits until the signal RBn received from the memory device 10 shifts from a busy state to a ready state (S31).

When the signal RBn shifts to the ready state, the memory controller 20 toggles the signals RB and RBn, and receives read data DAT from the memory device 10 (S32).

The ECC circuit 25 of the memory controller 20 executes an error detection process and an error correction process on the read data DAT received in the processing at S32. The ECC circuit 25 determines whether or not the error correction process has succeeded (S33).

If the error correction process has succeeded (S33; yes), the read operation in the memory controller 20 ends (END). If the read operation is caused by a read request from the host device 2, the memory controller 20 transmits error-corrected read data DAT to the host device 2.

If the error correction process has failed (S33; no), the memory controller 20 transmits a status read command to the memory device 10 (S34).

In response to the status read command, the memory controller 20 receives a CRD status from the memory device 10 (S35).

The memory controller 20 determines whether or not the CRD status received in the processing at S35 is a passed state (S36).

If the CRD status is a passed state (S36; yes), the memory controller 20 executes a retry operation of the read operation (S37). The retry operation includes, for example, re-executing the processing from S30 to S33. In the retry operation, the ECC circuit 25 of the memory controller 20 may apply a correction system different from the correction system in the previously executed error correction process. After the processing at S37, the read operation in the memory controller 20 ends (END).

If the CRD status is a failed state (S36; no), the memory controller 20 executes a hardware reset operation of the memory device 10 (S38). After the processing at S38, the read operation in the memory controller 20 ends (END).

Figure 12:
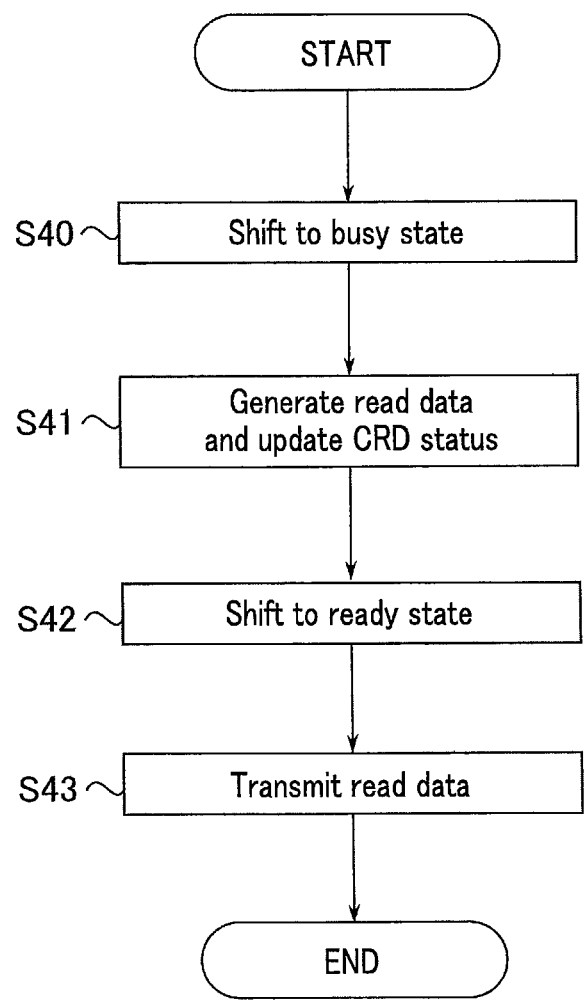
FIG. 12 is a flowchart showing an example of a read operation in the memory device according to the embodiment.

Next, a read operation in the memory device according to the embodiment will be described. FIG. 12 is a flowchart showing an example of a read operation in the memory device according to the embodiment. FIG. 12 shows processing of the memory device 10 during the processing of S31 of the memory controller 20 shown in FIG. 11.

Upon receiving a read command (START), the memory device 10 shifts to a busy state (S40).

The memory device 10 executes a read data generation operation and a CRD status update operation (S41). The read data generation operation is an operation of generating read data DAT based on a result of the sensing at the sense amplifier unit 19-1, and causes the data latch 19-2 to store the read data DAT. The memory device 10 causes the status register 200 to store the updated CRD status 210.

After the processing at S41, the memory device 10 shifts to a ready state (S42). That is, the memory device 10 transmits an H-level signal RBn to the memory controller 20.

The memory device 10 transmits the read data DAT stored in the data latch 19-2 in the processing at S41 to the memory controller 20 (S43).

After the processing at S43 ends, the read operation in the memory device 10 ends (END).

(Command Sequences)

Figure 13:
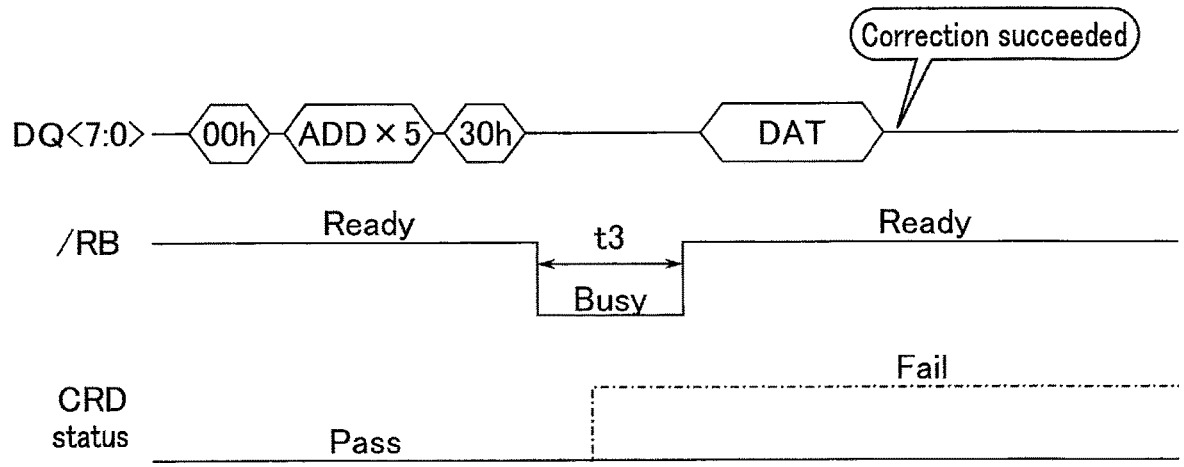
FIG. 13 is a command sequence showing an example of a read operation in the memory system according to the embodiment.
Figure 14:
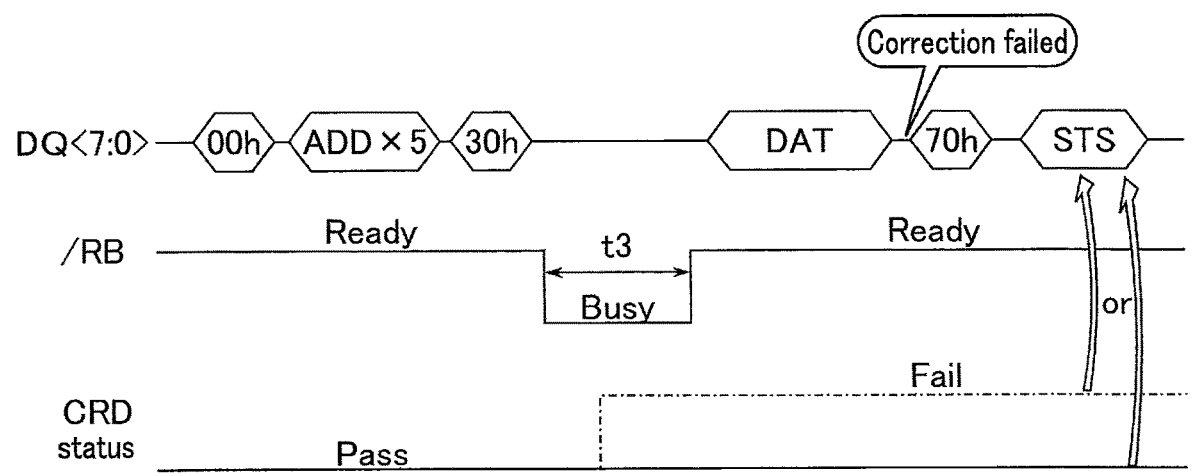
FIG. 14 is a command sequence showing an example of a read operation in the memory system according to the embodiment.

Next, a read operation in the memory controller according to the embodiment will be described with reference to command sequences. FIGS. 13 and 14 are command sequences each showing an example of a read operation in the memory system according to the embodiment. FIG. 13 shows a case where an error correction process on read data DAT has succeeded. FIG. 14 shows a case where an error correction process on read data DAT has failed.

As shown in FIGS. 13 and 14, the memory controller 20 transmits a command "00h" to the memory device 10. The command "00h" is a command that instructs reading of data from the memory device 10.

Subsequently, the memory controller 20 transmits an address ADD to the memory device 10 over, for example, five cycles. The address ADD includes, for example, a column address CAini.

Subsequently, the memory controller 20 transmits a command "30h" to the memory device 10. The command "30h" is a command that instructs the memory device 10 to execute a read data generation operation.

Upon receiving the command "30h", the memory device 10 shifts the signal RBn from a ready state to a busy state. Based on the column address CAini, the memory device 10 executes a CRD status update operation as well as a read data generation operation.

In the example of FIGS. 13 and 14, a case where the CRD status 210 is maintained at a passed state is shown by a solid line, and a case where the CRD status 210 is updated from the passed state to the failed state is shown by a dashed-dotted line. After the read data generation operation has ended, the memory device shifts the signal RBn from a busy state to a ready state. A busy-state period t3 does not change regardless of whether or not the CRD status 210 is updated from a passed state to a failed state.

Upon receiving a ready-state signal RBn, the memory controller 20 toggles the signals RE and REn.

The memory device 10 generates signals DQS and DQSn based on the signals RE and REn. The memory device 10 transmits read data DAT while toggling the signals DQS and DQSn.

The ECC circuit 25 of the memory controller 20 executes an error correction process on the received read data DAT. In the example of FIG. 13, the ECC circuit 25 succeeds in the error correction process. Accordingly, the read operation in the memory controller 20 ends. Thus, the CRD status 210 is not transmitted to the memory controller 20. On the other hand, in the example of FIG. 14, the ECC circuit 25 fails in the error correction process. Accordingly, it is determined that, in the read operation in the memory controller 20, either a retry operation or a hardware reset operation is to be executed. Thus, only in the example of FIG. 14, the memory controller 20 transmits a command "70h" to the memory device 10.

Upon receiving the command "70h", the memory device 10 transmits a CRD status 210 to the memory controller 20.

The memory controller 20 receives the CRD status 210 indicating either a passed state or a failed state. This allows the memory controller 20 to determine whether or not failure of an error correction process is due to the column addresses corresponding to the defective columns stored in the CRD latch group 123 not being in an ascending order.

1. 2. 3. CRD Status Update Operation

Next, a CRD status update operation in the memory device according to the embodiment will be described.

(When column addresses stored in a CRD latch group are in ascending order)

First, a case will be described where the defective column addresses stored in the CRD latch group 123 are in an ascending order. In this case, the CRD status 210 is maintained at a passed state.

Figure 15:
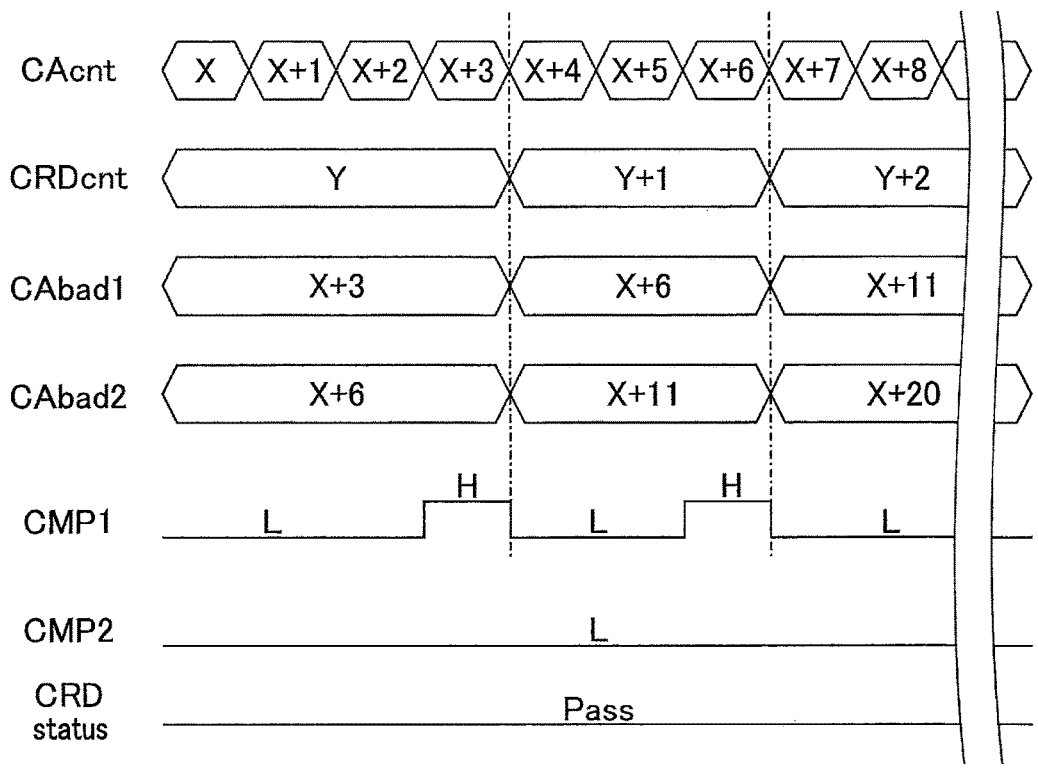
FIG. 15 is a timing chart showing an example of a CRD status update operation in the memory device according to the embodiment.

FIG. 15 is a timing chart showing an example of a CRD status update operation in the memory device according to the embodiment. In the example of FIG. 15, column addresses are stored in an ascending order in the CRD latch group 123. That is, in the example of FIG. 15, it is assumed that column addresses "X+3", "X+6", "X+11", and "X+20" are stored in the CRD latches 123<Y>, 123<Y+1>, 123<Y+2>, and 123<Y+3>, respectively. It is also assumed that a column address "Z" is stored in the subsequent CRD latches 123<Y+4>, 123<Y+5>, 123<Y+6>, . . . "Z" is a value further greater than "X+20". "Z" is, for example, a maximum value in an address space representing column addresses. In the example of FIG. 15, it is assumed that the column address CAcnt and the address CRDcnt are incremented from "X" and "Y", respectively.

While the address CRDcnt is "Y", "X+3" is transmitted to the comparison circuit 125 as the column address CAbad1. Also, "X+3" and "X+6" are transmitted to the comparison circuit 126 as the column addresses CAbad1 and CAbad2, respectively.

While the column address CAcnt is from "X" to "X+2", the comparison circuit 125 determines that the column addresses CAcnt and CAbad1 do not match. Accordingly, while the column address CAcnt is from "X" to "X+2", the signal CMP1 is at an L level. Based on the L-level signal CMP1, the access address correction circuit 130 transmits the column address CAcnt to the column selection circuit 19-3 as a column address CAmod. Thereby, when the column address CAcnt is from "X" to "X+2", a regular column is selected.

If the column address CAcnt is incremented to reach "X+3", the comparison circuit 125 determines that the column addresses CAcnt and CAbad1 match. Accordingly, while the column address CAcnt is "X+3", the signal CMP1 is at an H level. Based on the H-level signal CMP1, the access address correction circuit 130 transmits, in place of the column address CAcnt, a column address corresponding to a redundancy column to the column selection circuit 19-3 as a column address CAmod. Thereby, when the column address CAcnt is "X+3", a redundancy column is selected.

On the other hand, while the address CRDcnt is "Y", the comparison circuit 126 determines that the column address CAbad1 and the column address CAbad2 are in an ascending order. Accordingly, the signal CMP2 is at an L level. Thereby, the CRD status 210 is maintained at a passed state.

Based on the H-level signal CMP1, the CRD address counter 122 increments the address CRDcnt to "Y+1" in accordance with the timing at which the access address counter 121 increments the column address CAcnt to reach "X+4".

Subsequently, while the address CRDcnt is "Y+1", "X+6" is transmitted to the comparison circuit 125 as a column address CAbad1. Also, "X+6" and "X+11" are transmitted to the comparison circuit 126 as column addresses CAbad1 and CAbad2, respectively.

While the column address CAcnt is from "X+4" to "X+5", the comparison circuit 125 determines that the column addresses CAcnt and CAbad1 do not match. Accordingly, while the column address CAcnt is from "X+4" to "X+5", the signal CMP1 is at an L level. Based on the L-level signal CMP1, the access address correction circuit 130 transmits the column address CAcnt to the column selection circuit 19-3 as a column address CAmod. Thereby, when the column address CAcnt is from "X+4" to "X+5", a regular column is selected.

If the column address CAcnt is incremented to reach "X+6", the comparison circuit 125 determines that the column addresses CAcnt and CAbad1 match. Accordingly, while the column address CAcnt is "X+6", the signal CMP1 is at an H level. Based on the H-level signal CMP1, the access address correction circuit 130 transmits, in place of the column address CAcnt, a column address corresponding to a redundancy column to the column selection circuit 19-3 as a column address CAmod. Thereby, when the column address CAcnt is "X+6", a redundancy column is selected.

On the other hand, while the address CRDcnt is "Y+1", the comparison circuit 126 determines that the column address CAbad1 and the column address CAbad2 are in an ascending order. Accordingly, the signal CMP2 is at an L level. Thereby, the CRD status 210 continues to be maintained at a passed state.

Based on the H-level signal CMP1, the CRD address counter 122 increments the address CRDcnt to reach "Y+2" in accordance with the timing at which the access address counter 121 increments the column address CAcnt to reach "X+7".

If the address CRDcnt is incremented to reach "Y+3", "X+20" is transmitted to the comparison circuit 125 as a column address CAbad1. Also, "X+20" and "Z" are transmitted to the comparison circuit 126 as column addresses CAbad1 and CAbad2, respectively. In this case, too, the comparison circuit 126 determines that the column address CAbad1 and the column address CAbad2 are in an ascending order.

If the address CRDcnt is incremented to reach "Y+4", "Z" is transmitted to the comparison circuit 125 as a column address CAbad1. Since the column addresses CAcnt and CAbad1 do not match thereafter, the signal CMP1 output from the comparison circuit 125 is maintained at the L level.

Also, "Z" is transmitted to the comparison circuit 126 as column addresses CAbad1 and CAbad2. Upon recognizing that both of the column addresses CAbad1 and CAbad2 are "Z", which is a maximum value in an address space representing column addresses, the comparison circuit 126 stops the operation thereafter. Thereby, the signal CMP2 remains at the L level.

As described above, when the CRD status 210 is maintained at a passed state, a regular column is selected if the regular column is normal, and a redundancy column is selected if the regular column is defective.

(When Column Addresses Stored in a CRD Latch Group are not in Ascending Order)

Next, a case will be described where the defective column addresses stored in the CRD latch group 123 are not in an ascending order. In this case, the CRD status 210 is updated from a passed state to a failed state.

Figure 16:
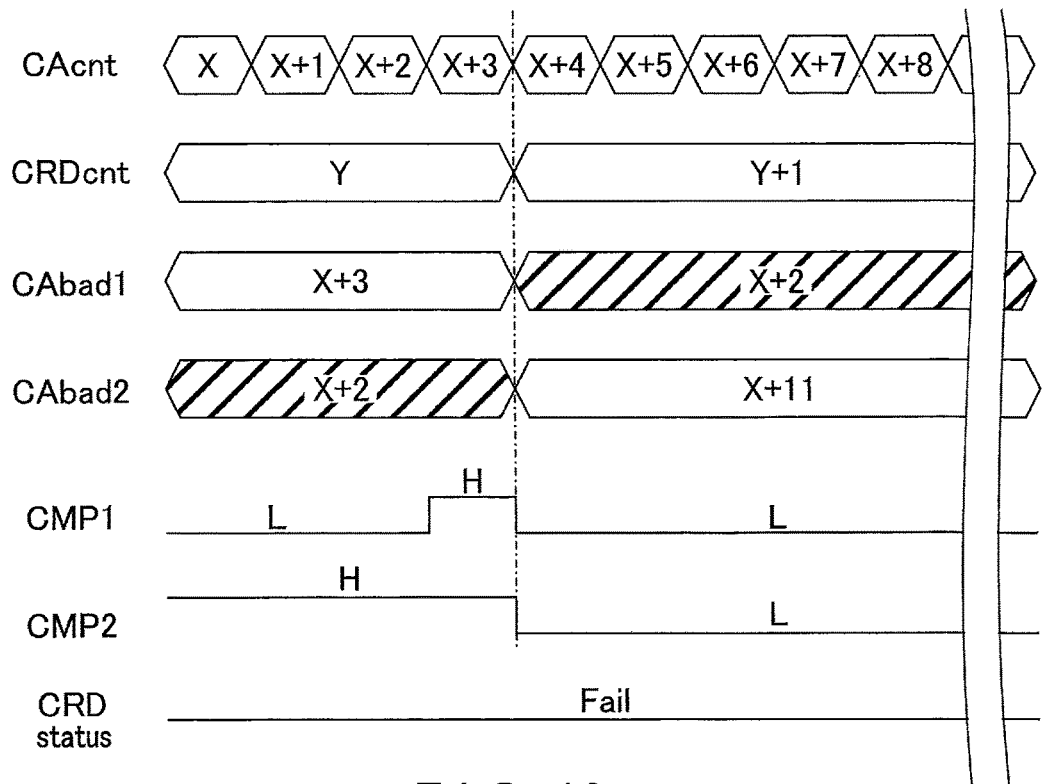
FIG. 16 is a timing chart showing an example of a CRD status update operation in the memory device according to the embodiment.

FIG. 16 is a timing chart showing an example of a CRD status update operation in the memory device according to the embodiment. In the example of FIG. 16, there are positions in the CRD latch group 123 where column addresses are not stored in an ascending order. That is, in the example of FIG. 16, it is assumed that column addresses "X+3", "X+2", and "X+11" are stored in the CRD latches 123<Y>, 123<Y+1>, and 123<Y+2>. In the example of FIG. 16, similarly to the example of FIG. 15, the column address CAcnt and the address CRDcnt are incremented, starting from "X" and "Y", respectively.

While the address CRDcnt is "Y", "X+3" is transmitted to the comparison circuit 125 as the column address CAbad1.

Also, "X+3" and "X+2" are transmitted to the comparison circuit 126 as the column addresses CAbad1 and CAbad2, respectively.

The operation relating to the comparison circuit 125 while the column address CAcnt is from "X" to "X+3" is similar to the case of FIG. 15. That is, when the column address CAcnt is from "X" to "X+2", a regular column is selected. When the column address CAcnt is "X+3", a redundancy column is selected. On the other hand, while the address CRDcnt is "Y", the comparison circuit 126 determines that the column address CAbad1 and the column address CAbad2 deviate from an ascending order. Accordingly, the signal CMP2 is at an H level. Thereby, the CRD status 210 is updated to a failed state.

Based on the H-level signal CMP1, the CRD address counter 122 increments the address CRDcnt to reach "Y+1" in accordance with the timing at which the access address counter 121 increments the column address CAcnt to reach "X+4".

Subsequently, while the address CRDcnt is "Y+1", "X+2" is transmitted to the comparison circuit 125 as a column address CAbad1. Also, "X+2" and "X+11" are transmitted to the comparison circuit 126 as column addresses CAbad1 and CAbad2, respectively.

Since the column address CAcnt is equal to or greater than "X+4" while the address CRDcnt is "Y+1", the column address CAcnt is always greater than the column address CAbad1. Thereby, the comparison circuit 125 determines that the column addresses CAcnt and CAbad1 do not match. Accordingly, while the address CRDcnt is "Y+1", the signal CMP1 is at an L level. Based on the L-level signal CMP1, the access address correction circuit 130 transmits the column address CAcnt to the column selection circuit 19-3 as a column address CAmod. Thereby, when the address CRDcnt is "Y+1", a regular column is selected regardless of whether or not the regular column is a defective column.

On the other hand, while the address CRDcnt is "Y+1", the comparison circuit 126 determines that the column address CAbad1 and the column address CAbad2 are in an ascending order. Accordingly, the signal CMP2 is at an L level. However, since the CRD status 210 is already a failed state, the failed state is maintained.

As described above, when the address CRDcnt is "Y+1", the signal CMP1 is maintained at the L level. Accordingly, no matter how much the column address CAcnt is incremented, the address CRDcnt is not incremented and maintained at "Y+1".

Thus, when the CRD status 210 is updated to a failed state, a regular column is selected without being replaced with a redundancy column regardless of whether the regular column is normal or defective.

1. 3. Advantageous Effects of Embodiment

According to the embodiment, column addresses corresponding to defective columns are respectively stored in N CRD latches 123<N:1>. The comparison circuit 126 determines whether or not a column address CAbad1 stored in a CRD latch 123<Y> and a column address CAbad2 stored in a CRD latch 123<Y+1> are in an ascending order. The determination result is stored as a CRD status 210. This allows the sequencer 14 to obtain information for suppressing defects of the memory device 10.

That is, in order to suppress an increase in circuit area, the number of column addresses that the comparison circuit 125 compares with the column address CAcnt may be limited to one. On the other hand, the column address CAcnt continues to be incremented, without being decremented. Accordingly, if the column address CAbad1 is not read in an ascending order from the CRD latch group 123, a state will occur in which the column address CAcnt does not match the column address CAbad1 no matter how much the column address CAcnt is incremented. Such a case is not preferable, since the access address correction circuit 130 cannot correct the column address CAmod from the column address CAcnt to a column address corresponding to a redundancy column.

According to the embodiment, the comparison circuit 126 determines whether or not the column address CAbad1 is incremented in an ascending order. If it is determined, in the determination, that the column address CAbad1 is incremented in an ascending order, the CRD status 210 is maintained at a passed state. If the column address CAbad1 is not incremented in an ascending order, the CRD status 210 is updated to a failed state. This allows the sequencer 14 to determine whether or not a redundancy column has been selected in place of a defective regular column, by referring to the CRD status 210.

Also, a CRD status update operation is performed every time a write operation or a read operation is performed. This allows the memory controller 20 to request the memory device 10 to transmit the CRD status 210 every time a write operation or a read operation is performed. Accordingly, if the CRD status 210 is in a failed state, the memory controller 20 can reset column addresses stored in the CRD latch group 123 in an ascending order by instructing a hardware reset operation to the memory device 10. It is thus possible to suppress defects of the memory device 10.

The memory controller 20 requests the memory device 10 to transmit a CRD status 210 if an error correction process has failed during a read operation. Thereby, processing can be omitted in the case where reception of the CRD status 210 is unnecessary. Accordingly, the processing load on the memory controller 20 can be reduced.

If the CRD status 210 is a failed state, the sequencer 14 ends the write operation, without executing a program sequence. Thereby, it is possible to reduce the possibility that data cannot be correctly read from the memory cell array 17 that occurs due to data being written into a defective regular column. Also, it is possible to reduce the processing load on the memory device 10.

2. Modification

The embodiment is not limited to the above-described examples, and various modifications are applicable.

In the above-described embodiment, a case has been described, as an example, where a single CRD circuit 120 is provided; however, the configuration is not limited thereto. For example, a plurality of CRD circuits 120 may be provided. In the description that follows, a description of configurations and operations similar to those of the embodiment will be omitted, and a description will be given mainly of configurations and operations different from those of the embodiment.

FIG. 17 is a block diagram showing an example of a configuration of a part of a register of a memory device according to a modification. FIG. 17 corresponds to FIG. 6 of the embodiment. As shown in FIG. 17, the address register 100 may include L CRD circuits 120_1, 120_2, . . . , and 120_L (where L is an integer equal to or greater than 3).

The CRD circuits 120_1, 120_2, . . . , and 120_L respectively include CRD latch groups 123_1, 123_2, . . . , and 123_L. The CRD latch group 123_1 includes N CRD latches 123_1<N:1>. The CRD latch group 123_2 includes N CRD latches 123_2<N:1>. Similarly, the CRD latch group 123_L includes N CRD latches 123_L<N:1>.

Addresses CRDcnt associated with the N CRD latches 123_1<N:1> are, in the order of the CRD latch 123_1<1>, 123_1 <2>, . . . , and 123_1<N>, in an ascending order. Addresses CRDcnt associated with the N CRD latches 123_2<N:1> are, in the order of the CRD latches 123_2<1>, 123_2 <2>, . . . , and 123_2<N>, in an ascending order. Similarly, addresses CRDcnt associated with the N CRD latches 123_L<N:1> are, in the order of the CRD latches 123_L<1>, 123_L<2>, . . . , and 123_L<N>, in an ascending order.

In the CRD latches 123_1<N:1>, 123_2<N:1>, . . . , and 123_L<N:1>, column addresses corresponding to defective columns are, in the order of the CRD latches 123_1<1>, 123_2 <1>, . . . , 123_L<1>, 123_1 <2>, 123_2 <2>, . . . , 123_L<2>, . . . , 123_1<N>, 123_2<N>, . . . , and 123_L<N>, stored in an ascending order, in response to, for example, a hardware reset operation of the memory device 10. Similarly to the embodiment, there are cases where the storage rules for the column addresses are not obeyed due to, for example, unintended data inversion, etc. after the hardware reset operation. Each of the CRD circuits 120_1, 120_2, . . . , and 120_L includes an access address counter 121, a CRD address counter 122, an address latch 124, comparison circuits 125 and 126, and a latch 127 (not illustrated) with configurations similar to those shown in FIG. 6. Each of the CRD circuits 120_1, 120_2, . . . , and 120_L operates based on, for example, an address CAini common to the columns. The CRD circuits 120_1, 120_2, . . . , and 120_L respectively transmit the signals CMP1<1>, CMP1<2>, . . . , and CMP1<L> to the access address correction circuit 130. The CRD circuits 120_1, 120_2, . . . , and 120_L respectively transmit the signals CMP2<1>, CMP2<2>, . . . , and CMP2<L> to the status register 200.

With the above-described configuration, the address register 100 is capable of operating the L CRD circuits 120_1 to 120_L in parallel. It is thereby possible to execute, in parallel, L replacement operations of replacing defective regular columns with redundancy columns. It is also possible to execute, in parallel, L CRD status update operations, together with the replacement operations. Accordingly, it is possible to cope with the cases where, for example, an end of a first replacement operation is not in time for a start of a second replacement operation, and an end of a first CRD status update operation is not in time for a start of a second CRD status update operation. The above-described cases include, for example, a case where defective columns continuously exist. It is thus possible to cope with the speeding up of data, while suppressing defects of the memory device.

3. Others

In the above-described embodiment and its modification, a case has been described where regular columns and redundancy columns are distinguished; however, the configuration is not limited thereto. For example, regular columns and redundancy columns need not be distinguished. Specifically, if a defective column exists, the defective column may be skipped.

In the above-described embodiment and its modification, a case has been described where the memory device 10 transmits a CRD status 210 to the memory controller 20 in response to a status read command; however, the configuration is not limited thereto. The memory device 10 may be configured to transmit a CRD status 210 to the memory controller 20 regardless of a status read command if the CRD status 210 is updated to a failed state.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A memory device comprising:
a memory cell array including a first column associated with a first address, a second column associated with a second address, and a third column associated with a third address;
a first latch which stores the first address and which is associated with a fourth address;
a second latch which stores the second address and which is associated with a fifth address, the fifth address being higher in address than the fourth address;
a first circuit which selects the third column in place of the first column based on the first address;
a second circuit which determines, in each of a write operation and a read operation in which the third column is selected, whether or not the second address is higher in address than the first address; and
a third circuit configured to end the write operation without storing data in the memory cell array when it is determined, in the determination by the second circuit in the write operation, that the second address is not higher in address than the first address.

2. The memory device according to claim 1, wherein the third circuit is configured to end the write operation after storing data in the memory cell array when it is determined, in the determination by the second circuit in the write operation, that the second address is higher in address than the first address.

3. The memory device according to claim 1, wherein a duration of the write operation when it is determined, in the determination by the second circuit, that the second address is not higher in address than the first address, is shorter than a duration of the write operation when it is determined, in the determination by the second circuit, that the second address is higher in address than the first address.

4. The memory device according to claim 1, wherein the third circuit is configured to, in the read operation, transmit data read from the memory cell array to a memory controller, regardless of whether or not the second address is higher in address than the first address.

5. The memory device according to claim 1, wherein the third circuit is configured to transmit a result of the determination by the second circuit to a memory controller.

6. The memory device according to claim 5, wherein the third circuit is configured to transmit the result of the determination by the second circuit to the memory controller in response to a command from the memory controller.

7. The memory device according to claim 1, wherein:
the first column and the second column are defective columns, and
the third column is a regular column.

8. The memory device according to claim 1, wherein the third column is a redundancy column.

9. The memory device according to claim 1, wherein:
the memory cell array further comprises a fourth column associated with a sixth address, a fifth column associated with a seventh address, and a sixth column associated with an eighth address, and
the memory device further comprises:
a fourth latch which stores the sixth address and which is associated with a ninth address;
a fifth latch which stores the seventh address and which is associated with a tenth address, the tenth address being higher in address than the ninth address; and
a fourth circuit which determines whether or not the seventh address is higher in address than the sixth address, and
the first circuit is configured to further select the sixth column in place of the fourth column based on the sixth address.

10. The memory device according to claim 9, wherein:
the sixth address is higher in address than the first address, and
the seventh address is higher in address than the second address.

11. The memory device according to claim 9, wherein the fourth circuit is configured to determine, in each of a write operation and a read operation in which the sixth column is selected, whether or not the seventh address is higher in address than the sixth address.

12. A memory device comprising:
a memory cell array including a first column associated with a first address, a second column associated with a second address, a third column associated with a third address, a fourth column associated with a sixth address, a fifth column associated with a seventh address, and a sixth column associated with an eighth address;

a first latch which stores the first address and which is associated with a fourth address;

a second latch which stores the second address and which is associated with a fifth address, the fifth address being higher in address than the fourth address;

a first circuit which selects the third column in place of the first column based on the first address;

a second circuit which determines whether or not the second address is higher in address than the first address;

a fourth latch which stores the sixth address and which is associated with a ninth address;

a fifth latch which stores the seventh address and which is associated with a tenth address, the tenth address being higher in address than the ninth address; and a fourth circuit which determines whether or not the seventh address is higher in address than the sixth address, wherein:

the first circuit is configured to further select the sixth column in place of the fourth column based on the sixth address, the fourth circuit is configured to determine, in each of a write operation and a read operation in which the sixth column is selected, whether or not the seventh address is higher in address than the sixth address, and the memory device further comprises a third circuit configured to end the write operation without storing data in the memory cell array when it is determined, in the determination by the second circuit and the fourth circuit in the write operation, that the second address is not higher in address than the first address or that the seventh address is not higher in address than the sixth address.

13. The memory device according to claim 12, wherein the third circuit is configured to end the write operation after storing data in the memory cell array when it is determined, in the determination by the second circuit and the fourth circuit in the write operation, that the second address is higher in address than the first address, and that the seventh address is higher in address than the sixth address.

14. The memory device according to claim 12, wherein a duration of the write operation when it is determined, in the determination by the second circuit and the fourth circuit, that the second address is not higher in address than the first address or that the seventh address is not higher in address than the sixth address, is shorter than a duration of the write operation when it is determined, in the determination by the second circuit and the fourth circuit, that the second address is higher in address than the first address and that the seventh address is higher in order than the sixth address.

15. The memory device according to claim 12, wherein the third circuit is configured to, in the read operation, transmit data read from the memory cell array to a memory controller, regardless of whether or not the second address is higher in address than the first address, and whether or not the seventh address is higher in address than the sixth address.

16. The memory device according to claim 12, wherein the third circuit is configured to transmit a result of the determination by the second circuit and the fourth circuit to a memory controller.

17. The memory device according to claim 16, wherein the third circuit is configured to transmit the result of the determination by the second circuit and the fourth circuit to the memory controller in response to a command from the memory controller.

* * * * *